(12) United States Patent
Baumgartner et al.

(10) Patent No.: US 7,739,635 B2
(45) Date of Patent: Jun. 15, 2010

(54) CONJUNCTIVE BDD BUILDING AND VARIABLE QUANTIFICATION USING CASE-SPLITTING

(75) Inventors: Jason R. Baumgartner, Austin, TX (US); Christian Jacobi, Boblingen (DE); Viresh Paruthi, Austin, TX (US); Jiazhao Xu, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 482 days.

(21) Appl. No.: 11/746,836

(22) Filed: May 10, 2007

(65) Prior Publication Data
US 2008/0282207 A1 Nov. 13, 2008

(51) Int. Cl.
G06F 17/50 (2006.01)
G06F 9/45 (2006.01)

(52) U.S. Cl. .............. 716/5; 716/4; 716/18; 703/13; 703/14

(58) Field of Classification Search .......... 716/4–5, 716/18; 703/13–14
See application file for complete search history.

(56) References Cited

U.S. PATENT DOCUMENTS

| | | | |
|---|---|---|---|
| 5,502,661 A | 3/1996 | Glunz | |
| 5,623,418 A | 4/1997 | Rostoker et al. | |
| 5,910,897 A | 6/1999 | Dangelo et al. | |
| 5,946,472 A | 8/1999 | Graves et al. | |
| 6,052,524 A | 4/2000 | Pauna | |
| 6,088,821 A | 7/2000 | Moriguchi et al. | |
| 6,327,687 B1 | 12/2001 | Rajski et al. | |
| 6,353,806 B1 | 3/2002 | Gehlot | |
| 6,359,345 B1 | 3/2002 | Suzuki | |
| 6,634,012 B2 | 10/2003 | Zhong et al. | |
| 6,745,160 B1 | 6/2004 | Ashar et al. | |
| 6,842,750 B2 | 1/2005 | Andreev et al. | |
| 7,096,138 B2 * | 8/2006 | Akli et al. | 702/117 |
| 7,340,473 B2 | 3/2008 | Paruthi et al. | |
| 7,363,603 B2 | 4/2008 | Jacobi et al. | |
| 2002/0156540 A1 * | 10/2002 | Akli et al. | 700/12 |

OTHER PUBLICATIONS

Peranandam et al.; "Transaction Level Verification and Coverage Metrics by Means of Symbolic Simulation"; Department of Computer Engineering; University of Tübingen, 2004, p. 260-269.

(Continued)

*Primary Examiner*—Thuan Do
*Assistant Examiner*—Nghia M Doan
(74) *Attorney, Agent, or Firm*—Dillon & Yudell LLP (57) ABSTRACT

A method, apparatus and computer-readable medium for conjunctive binary decision diagram building and variable quantification using case-splitting are presented. A BDD building program builds a BDD for at least one node in a netlist graph representation of a circuit design. One or more variables are selected for case-splitting. The variable is set to a constant logical value and then the other. A BDD is built for each case. The program determines whether the variable is scheduled to be quantified out. If so, the program combines the BDDs for each case according to whether the quantification is existential or universal. If the variable is not scheduled to be quantified, the program combines the BDDs for each case so that the variable is introduced back into the resulting BDD, which has a reduced number of peak live nodes.

17 Claims, 5 Drawing Sheets

OTHER PUBLICATIONS

H. Andersen; "An Introduction Into Binary Decision Diagrams"; Technical University of Denmark; Oct. 1997.

R. Bryant; "Graph-Based Algorithms for Boolean Function Manipuation"; IEEE Transactions on Computers; C-35-8; pp. 667-691; Aug. 1986.

R. Rudell; Dynamic Variable Ordering for Ordered Binary Decision Diagrams; IEEE; 1993; pp. 42-47.

L. Turbak; "Depth-First Search and Related Graph Algorithms"; Wellesley College; Nov. 28, 2001.

Peranandam et al., "Transaction Level Verification and Coverage Metrics by Means of Symbolic Simulation"; Department of Computer Engineering, University of Tubingen; 2004; pp. 260-269.

Anderson, "An Introduction to Binary Decision Diagrams"; Lecture notes for 49285 Advanced Algorithms E97; Department of Information Technology, Technical University of Denmark; Oct. 1997; 37 pp.

Bryant, "Graph-Based Algorithms for Boolean Function Manipulation"; Abstract; Department of Computer Science, Carnegie-Mellon University, Pittsburgh, PA; IEEE Transactions on Computers (Update—Aug. 1986); 28 pp.

Rudell, "Dynamic Variable Ordering for Ordered Binary Decision Diagrams"; 1993 IEEE; 6 pp.

Turbak, "Depth-First Search and Related Graph Algorithms"; Handout #36, CS231 Algorithms, Wellesley College; Nov. 2001; 8 pp.

* cited by examiner

CONJUNCTIVE BDD BUILDING AND VARIABLE QUANTIFICATION USING CASE-SPLITTING

CROSS-REFERENCE TO RELATED APPLICATIONS

The present application is related to the subject matter of the following commonly assigned, co-pending United States patent applications:

(1) U.S. patent application Ser. No. 10/926,587; entitled "Method and System for Building Binary Decision Diagrams Efficiently in a Structural Network Representation of a Digital Circuit"; filed Aug. 26, 2004; and (2) U.S. patent application Ser. No. 11/225,651; entitled "Method and System for Case-Splitting on Nodes in a Symbolic Simulation Framework"; filed Sep. 13, 2005.

BACKGROUND OF THE INVENTION

1. Field of the Invention

The present invention relates in general to verifying circuit designs and in particular to representing a logic function of a circuit design in a binary decision diagram. Still more particularly, the present invention relates to a system, method and computer-readable medium for building binary decision diagrams for nodes in a netlist representation of a circuit design more optimally and performing on-demand variable quantification using case-splitting.

2. Description of the Related Art

Many tasks in computer-aided design (CAD) of digital circuits, such as equivalence checking, property checking, logic synthesis, false-paths analysis require Boolean reasoning on problems derived from circuit structures. A netlist graph is a means for representing problems derived from these circuit structures. Such a representation is non-canonical and offers limited ability to reason about the function at the nodes in the graph. Binary decision diagrams (BDDs) can be used for efficiently applying Boolean reasoning to problems derived from such circuit structures. A BDD offers a compact and functionally canonical representation of the Boolean function of a node in the netlist graph, which makes it easy and fast to reason about its function.

Unfortunately, the size of BDDs, and the complexity involved with manipulating them, is very sensitive to the order in which variables appear in the BDDs. This sensitivity to variable ordering can result in exponential space complexity of the BDD. BDD packages that implement BDD building and manipulation algorithms use Dynamic Variable Ordering (DVO) algorithms to reduce the number of BDD nodes periodically. These algorithms tend to be expensive in both time and space complexity. Therefore, BDD software packages rely on heuristics to compute a local minimum as opposed to a global minimum for reducing the number of BDD nodes, since computing a global minimum is prohibitively expensive in space as well as in time. Starting with a good initial order and computing a good order when the number of BDD nodes is relatively small is strongly suggested. Many applications set an upper limit on the number of allowed BDD nodes to prevent a "runaway" BDD operation. The upper limit can be on the number of BDDs allowed to exist at any point in time in a BDD package due to the data structures used, or due to the available memory of the computer system on which the BDD package is running. The presence of spurious BDDs may cause this limit to be hit prematurely and make a big difference in whether the computation is able to be completed.

Additionally, it may be the case that the application requiring the building of BDDs may need to quantify certain variables, for example when performing symbolic model checking. Typical quantification approaches build the BDDs to completion before resorting to quantification of the variables and are therefore prone to memory overruns during their BDD-building phase.

SUMMARY OF THE INVENTION

The present invention includes, but is not limited to, a method, apparatus and computer-readable medium for conjunctive binary decision diagram building and variable quantification using case-splitting. In a preferred embodiment, a BDD building program builds a binary decision diagram for at least one node in a netlist graph representation of a circuit design. One or more variables are selected for case-splitting. This entails building one binary decision diagram with a variable assigned a constant logical value (e.g. zero), then building a second binary decision with the same variable assigned the other constant logical value (e.g. one). The program determines whether the variable is scheduled to be existentially quantified, universally quantified, or not quantified at all. If the variable is scheduled to be existentially quantified, a binary decision diagram is built equal to the logical disjunction of the binary decision diagrams for each case of the variable being assigned a constant logical value. If the variable is scheduled to be universally quantified, a binary decision diagram is built equal to the logical conjunction of the binary decision diagrams for each case. If the variable is not scheduled to be quantified, a binary decision diagram is built by logically combining the binary decision diagrams for each case so that the variable is introduced back into the combined binary decision diagram. The binary decision diagrams are generated by a computer system and one or more binary decision diagrams are stored in a computer-readable medium, whereby that binary decision diagram has a reduced number of peak live nodes. The above, as well as additional purposes, features, and advantages of the present invention will become apparent in the following detailed written description.

BRIEF DESCRIPTION OF THE DRAWINGS

This invention is described in a preferred embodiment in the following description with reference to the drawings, in which like numbers represent the same or similar elements, as follows.

DETAILED DESCRIPTION

The present invention provides an improved method, system, and computer-readable medium for building binary decision diagrams (BDDs) for nodes in a structural netlist representation of a circuit design (a netlist graph). As described below, the present invention applies case-splitting to enable optimal building of BDDs. An aspect of the present invention includes case-splitting on a selected variable during BDD building if a certain threshold on system memory consumption is reached. Another aspect of the present invention includes leveraging case-splitting to perform "on-the-fly" variable quantification during the BDD building, as opposed to going through an explicit quantification step later.

Figure 1:
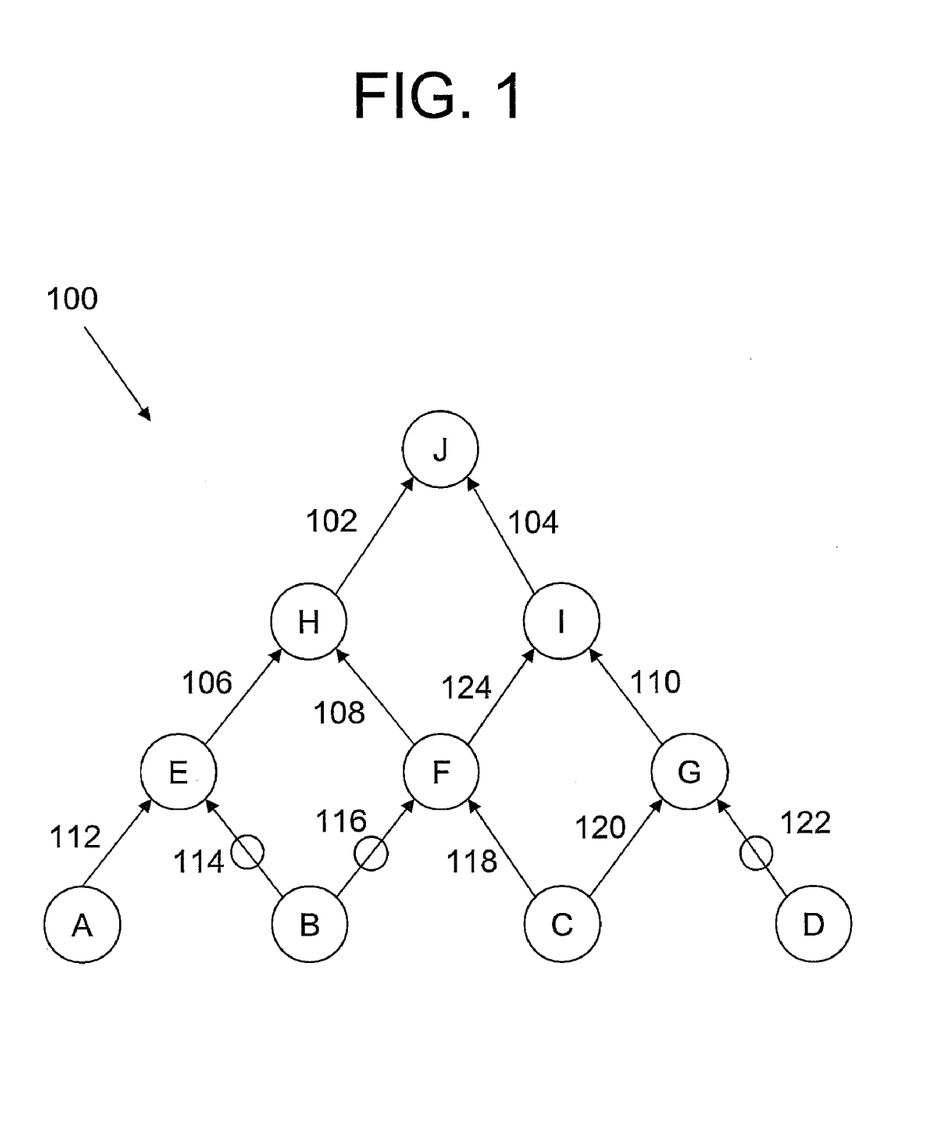
FIG. 1 is a netlist graph of a circuit design wherein vertices (nodes) represent logic gates, and edges represent interconnections between those gates.

With reference now to the figures, and in particular FIG. 1, netlist graph 100 is shown. A netlist graph is a directed graph with vertices (nodes A-J) representing logic gates, and edges 102-122 representing interconnections between those gates. The gates have associated functions, such as constants, primary inputs, combinational logic such as AND gates, and sequential elements (such as registers). Registers have two associated components: their next-state functions, and their initial-value functions; both are represented as other gates in the graph. Certain gates in the netlist are known as "primary outputs", "targets", "constraints", etc. In a preferred embodiment, the disclosed method is applied to a netlist graph where the only combinational gate type is a 2-input AND gate and inversions are represented implicitly as edge attributes (see edges 114, 116 and 122).

A set of sink nodes for which BDDs need to be built are identified. Examples of sink nodes are outputs in an equivalence-checking or false-paths analysis setting, or targets in a property-checking or model-checking setting. In netlist graph 100, node J is an exemplary sink node for which a BDD needs to be built. The BDD-building algorithm traverses netlist graph 100 topologically and builds BDDs for intermediate nodes E-I in a bottom-up fashion starting at input nodes A-D. Once the BDDs for all the fan-outs of a node have been built, the BDD for that node can be freed or de-referenced. Note that it is important to free BDDs that are no longer needed in order to keep the number of BDD nodes in the BDD package to a minimum so that expensive BDD operations such as DVO are not impacted by the presence of spurious nodes.

A BDD, once reduced, is a compact and functionally canonical representation of the Boolean function of a node in a netlist graph. Case-splitting entails selecting a variable from the Boolean function for a node and setting the selected variable to a constant Boolean value. For example, the selected variable is set to a logical 0 and the BDD building process continues. The variable may be chosen randomly or by using heuristics, such as choosing the variable for which a constant assignment of its value may result in a maximum reduction of memory required to complete the operation. Once the BDDs for the sink nodes are obtained with the variable set to the chosen constant (0 in this example), BDDs are then built for the sink nodes by setting the same variable to the other constant (1 in this example) and repeating the process. Once this is complete, the two sets of BDDs are combined to obtain the BDD for the complete function of the sink nodes. The process then re-introduces the case-split variable and combines the two sets of BDDs with the correct polarity associated with setting the variable to constants.

While this method has been described in the context of selecting a single variable to case-split upon at any given point in time, it is equally applicable and easily extended to the situation where multiple variables may be selected to case-split upon. This results in a sequence of case-splits that form a "tree" of computations. In a tree-like representation of the case-splits, in general the number of children any tree node has should equal the total number of possible value assignments to the case-split variables to ensure complete coverage.

Figure 2:
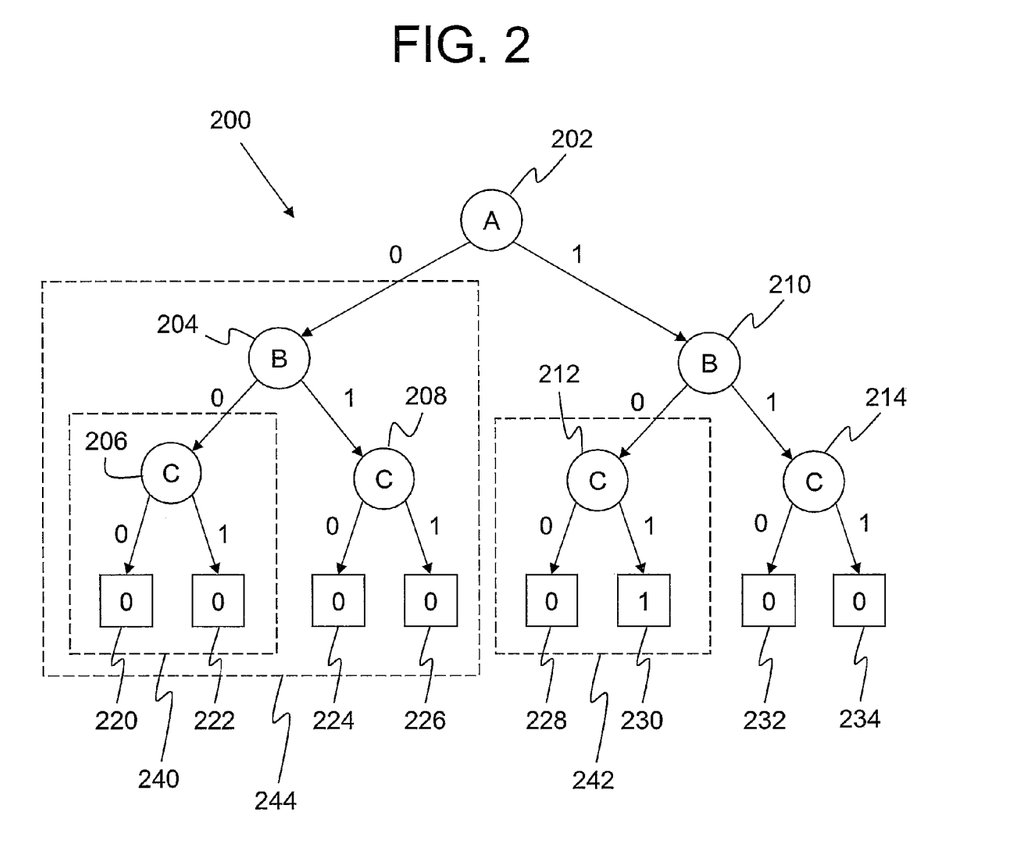
FIG. 2 is a binary decision tree for a node in a netlist graph of a circuit design, demonstrating case-splitting and the reduction of live nodes as a result of case-splitting in accordance with a preferred embodiment of the present invention.

For example, to build the BDD for sink node J, BDDs for intermediate nodes H and I need to be constructed. With reference now to FIG. 2, binary decision tree 200 for node H is shown. Case-split evaluations can be visualized as a decision tree in which each node of the tree represents a case-split in time. The children of the tree node represent the evaluations by setting the case-split variable to the selected constant. The tree node corresponding to this case-split will have two children, one each for '0' and '1' value. The Boolean function for node H is represented as a rooted, directed, acyclic graph, which consists of decision nodes 202-214 and terminal nodes 220-234. Each decision node is labeled by a Boolean variable and has two child nodes. The edge from a node to a low child represents an assignment of the variable to "0". The edge from a decision node to a high child represents an assignment of the variable to "1".

In this example, node H of FIG. 2 is a function of three variables A-C. BDD building program 548 (FIG. 5) case-splits on variable B, initially assigning it a constant value of "1", and builds a BDD for that case. As a result, decision nodes 206 and 212 and terminals 220, 222, 228 and 230 (shown in boxes 240 and 242) are removed from binary decision tree 200, resulting in a reduction of the overall number of decision nodes needed to compute the reduced-order BDD for this case. Once the BDD for the case where variable B is assigned a value of "1" is constructed, BDD building program 748 builds a BDD for the other case (where variable B is assigned a value of "0"). As a result, decision nodes 208 and 214 and terminals 228, 230, 232 and 234 are removed from binary decision tree 200. This reduces the overall number of decision nodes needed to compute the reduced-order BDD for this case.

In this example, the reduction of nodes may seem trivial due to the simplicity of the example. But for a BDD with a large number of variables, as is the case in modern circuit designs, case-splitting can result in a significant number of decision nodes being removed from the computation. This reduces the amount of time and system memory required to perform the building operation, in some cases allowing BDD building to complete where memory overruns would otherwise prevent it from doing so. Dynamic Variable Ordering (DVO) algorithms try to compute a good variable order to reduce the number of BDD nodes. The reduction in BDD sizes due to case-splitting allows DVO algorithms to converge on the best order needed for building all the BDDs by optimizing the smaller BDDs obtained after case-splitting. This can also significantly reduce overall runtime and memory requirements.

Once the BDDs for both cases are constructed, BDD building program 548 re-introduces case-split variable B and combines the BDDs for each case, taking into account the correct polarity associated with setting the variable to constants. This is demonstrated as follows. In this example, the case-split variable is variable B. Let the BDD obtained for node H by setting variable B to "0" be called "BDD_0", and let the BDD obtained for node EI by setting variable B to "1" be called "BDD_1". BDD building program 548 builds the BDD for node H according to the following expression derived from the Shannon expansion of a Boolean function:

$$H = !B * \text{'}BDD\_0\text{'} + B * \text{'}BDD\_1\text{'}$$

where,

"*" denotes a logical conjunction (AND)
"+" denotes a logical disjunction (OR), and
"!" denotes a logical inversion (NOT) of the variable it precedes.

Case-splitting on multiple variables ensures that the sizes of intermediate BDDs do not exceed a specified size limit. This enables BDD building program 548 to complete its operation for an entire circuit design where limitations on resources (such as available memory on the machine) would have otherwise prevented completion. In accordance with a preferred embodiment, BDD building program 548 introduces a case-split when a specified threshold (specified either by the user or automatically determined based on the resources, such as memory available in the computer system) is exceeded during BDD construction. BDD building program 548 then continues until it completes (the number of steps to be checked are completed) or it again runs out of resources, at which point another case-split is performed.

Referring again to FIG. 2, BDD building program 548 performs a case-split on variable A. As a result, decision nodes 204 and 208 and terminals 224 and 226 (shown in box 244) are also removed from binary decision tree 200, resulting in a further reduction of the overall number of decision nodes needed to compute the reduced-order BDD for this case. Once the BDD for the case where variable A is assigned a value of "1" is constructed, BDD building program 548 builds a BDD for the other case (where variable A is assigned a value of "0"). As a result, decision nodes 210 and 214 and terminals 232 and 234 are removed from binary decision tree 200. BDD building program 548 then combines the BDDs and returns to the previous case-split for variable B.

Figure 5:
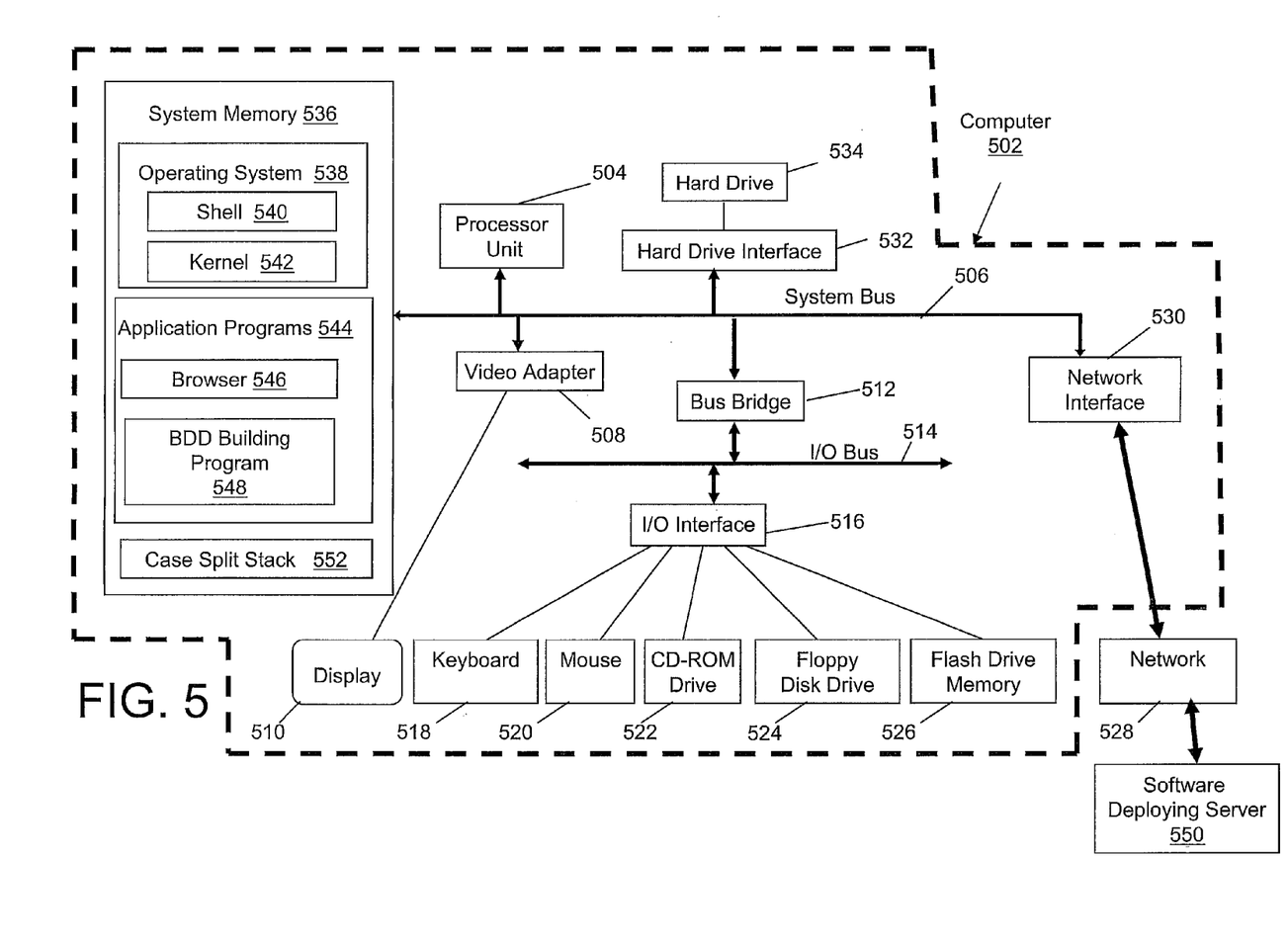
FIG. 5 is a block diagram of a general-purpose data processing system with which the present invention of a method, system and computer program product for conjunctive BDD building and variable quantification using case-splitting may be performed.

Multiple case-splits are stored on case-split stack 552 in system memory 536 (see FIG. 5). Once all steps have been checked and a BDD is obtained for one of the case-splits variables, the process backtracks to the most recent case-split and tries the next value for that variable. Backtracking involves going back to a previous time-step and then continuing from there. This process proceeds in a first-in-first-out (FIFO) manner and continues until the stack becomes empty. This ensures the completeness of the entire process so that all possible values for all variables have been considered. The stack may dynamically grow and shrink. As the process backtracks to the most recent case-split and assigns the case-split variable the next value, it is possible for another case-split to be applied while the current case for the first case-split is being tried. This new case-split is then entered on the stack. It should also be noted that a stack entry consists of all BDDs that are live just before the case-split (i.e. a snapshot of all live BDDs is taken at the time of the case-split). This is done in order to be able to recreate the state once the process backtracks to this case-split and processes the next branch.

As mentioned above, certain applications require a set of variables to be quantified out. This is typically a separate operation that is performed after BDD construction is complete. If BDD construction is unable to be completed, then quantification of variables cannot be performed. In accordance with a preferred embodiment of the present invention, variable quantification is performed concurrently with the BDD construction process, eliminating an explicit quantification step later on. This is accomplished by "biasing" the case-splitting towards variables that are to be quantified. The two sets of BDDs are then combined appropriately without the need to re-introduce variables that are scheduled to be quantified out (as in the approach of case-splitting upon variables that are not to be quantified out). Such an approach helps keep resource usage in check during BDD building, while providing the additional benefit of variable quantification on an as-needed basis. If a variable is to be existentially quantified then the BDD for the node would be (BDD_0+ BDD_1). If the variable is to be universally quantified it would be (BDD_0& BDD_1). The variable itself is not re-introduced back into the expression to obtain the BDD, since it has been quantified out.

Figure 3:
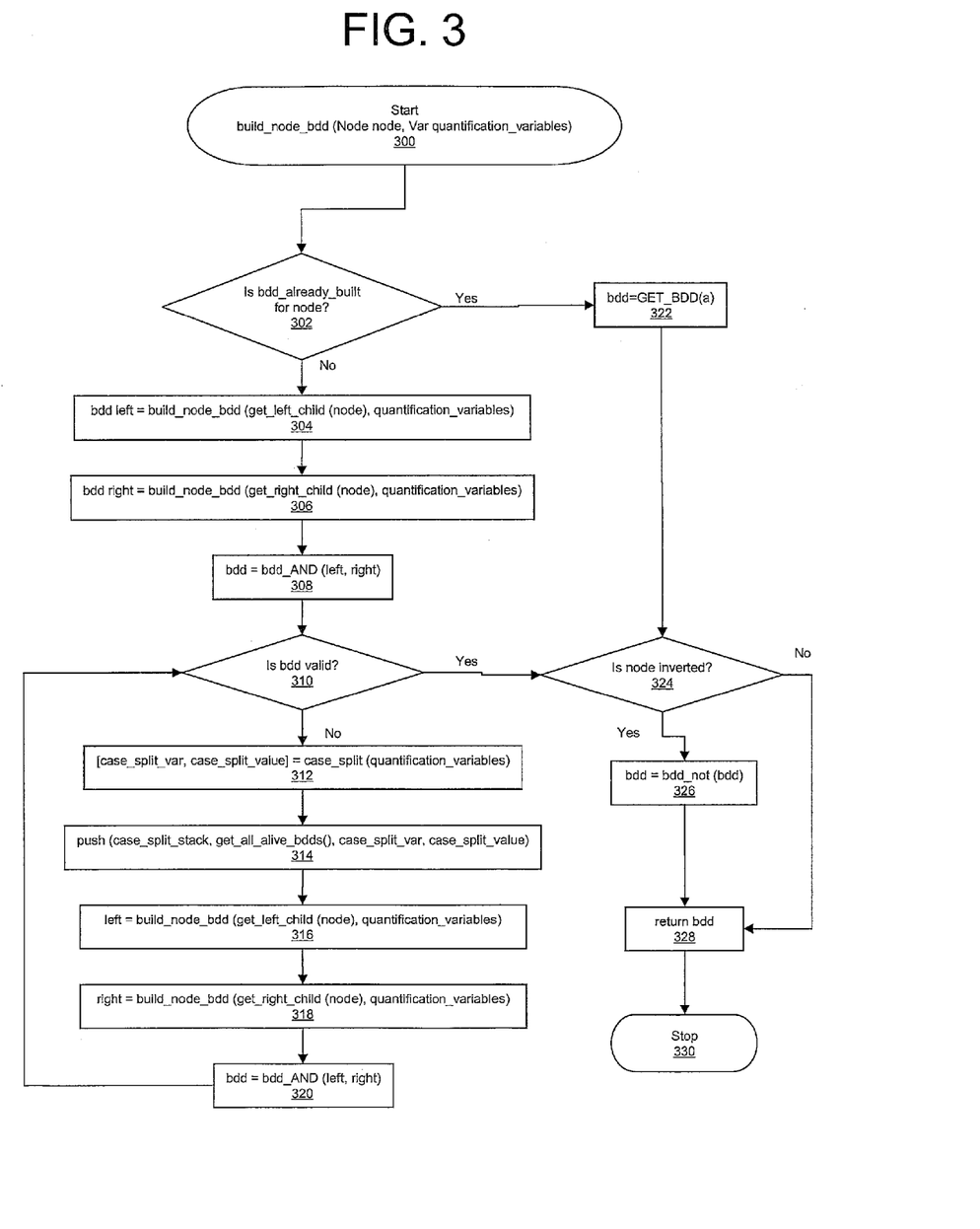
FIG. 3 is a flowchart for a computer program that builds BDDs for a node in a netlist graph of a circuit design using case-splitting.

With reference now to FIG. 3, a flowchart is shown for a computer program that builds BDDs for a node in a netlist graph of a circuit design using case-splitting. The BDD-building process begins at initiator block 300 as the function "build_node_bdd", which is provided a set of variables that can be quantified out. The process checks to see if a BDD is already built for the node. If so, the process goes to step 322. If not, the process begins building a BDD for the node by building BDDs for the inputs to that node and conjoining them with each other (steps 304-308). If these steps are successful, the process goes to step 324. If the process reaches the point where additional BDDs cannot be built due to resource exhaustion, then case-splits are performed. The process chooses a variable to case-split and assigns it a value (step 312). The "case_split" routine biases its selection towards the variables that are on the quantification variables list. It picks out the "fattest" variable (a variable that has the highest peak number of nodes in all the live BDDs) among the variables that can be quantified and compares the reduction obtained against a reduction threshold. If the reduction is below the threshold it picks a variable among the other variables if the reduction obtained is higher. Once those are exhausted, it picks the next set of variables to case-split upon based on metrics such as the number of BDD nodes eliminated due to setting a variable to a constant.

Once the process selects a variable to case-split and the value to apply to it, the process performs the case-split by taking a snapshot of all BDDs for all nodes and storing them on case-split stack 552 (step 314). The process then continues with the BDD-building computation, with reduced resource consumption due to applying a constant to the case-split variable. It builds the BDD for the left child node (step 316) and the right child node (step 318) with the case-split variable set to a constant value and conjoins the two child nodes (step 320). The process returns to step 310 and checks to see if the BDD is valid. This process repeats recursively until a valid BDD is constructed. Then the process moves to step 324, where the process checks to see if the output of the node is to be inverted (step 324), and if so performs the inversion (step 326). The completed "pre-case-split" BDD is returned to the calling function (step 328) and the process stops at terminator block 330.

Figure 4:
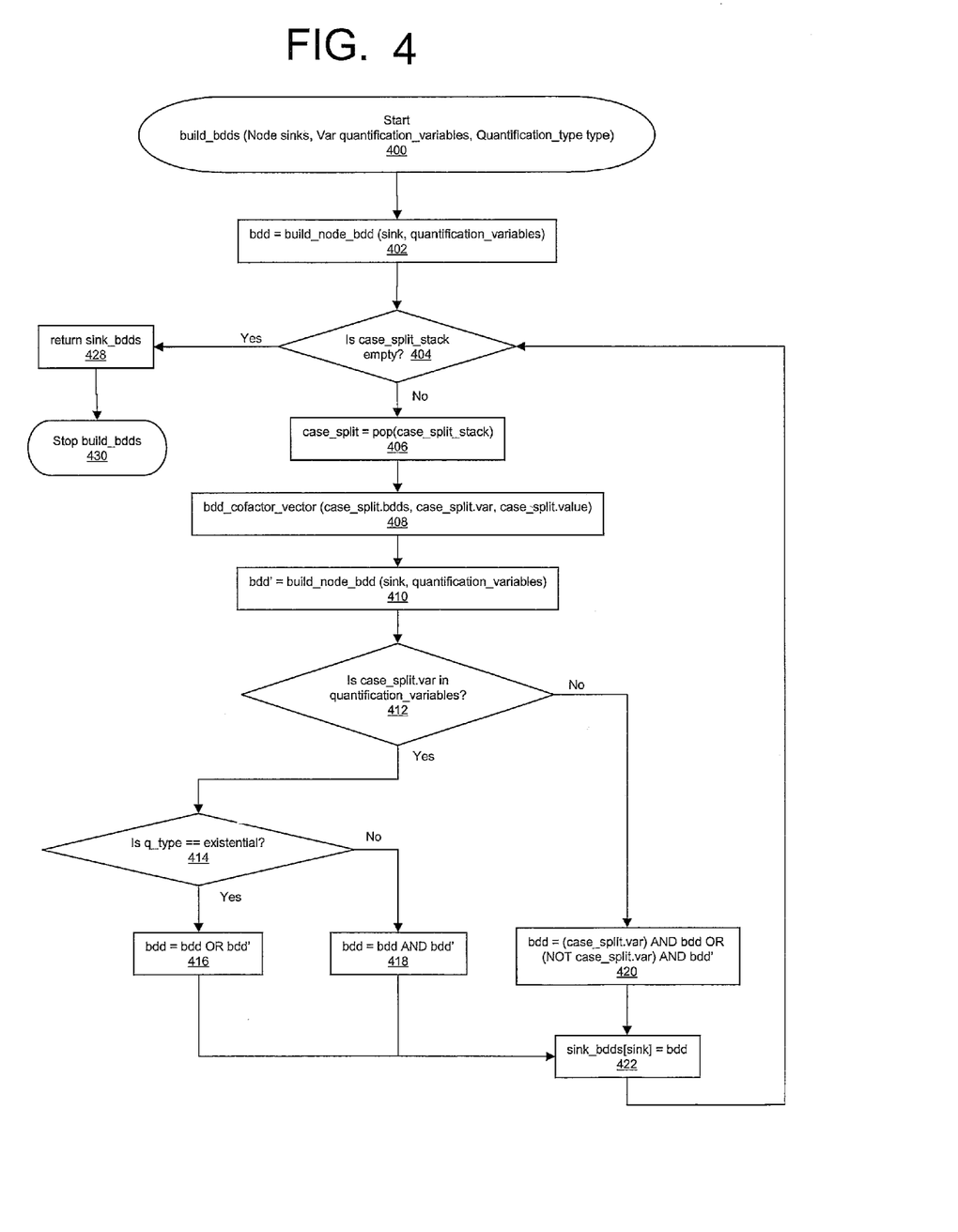
FIG. 4 is a flowchart for a computer program that builds BDDs for each identified sink node in a netlist graph of a circuit design using case-splitting and on-demand variable quantification.

With reference now to FIG. 4, a flowchart is shown for a computer program that builds BDDs for each identified sink node in a netlist graph of a circuit design using case-splitting and on-demand variable quantification. The process starts at initiator block 400 and repeats for each sink node that needs have a BDD built. The process calls the "build_node_bdd" function described above (see FIG. 3) to build BDDs for each sink node (step 402). When the BDD is returned, the process checks to see if the case-split stack is empty (step 404). If it is, then the process returns the BDD to the calling function (step 428) and terminates (step 430). If the case-split stack is not empty, the process retrieves the most recent case-split from the case-split stack (step 406). It then applies the chosen constant value for the case-split variable to all live BDDs (step 408) and builds BDDs for those nodes recursively (step 410).

After a BDD is built with the case-split variable set to a constant value, the process checks to see if that variable is in the list of variables that are scheduled to be quantified out (step 412). If so, the process checks to see if the quantification type for that variable is to be existential or universal (step 414). If the variable is to be existentially quantified, then the BDDs for the two cases are logically disjoined (step 416). If the variable is to be universally quantified, then the BDDs for the two cases are logically conjoined (step 418). If the case-split variable is not scheduled for quantification, then after step 412, the process goes to step 420, where the BDDs for the two cases are combined using the Shannon expansion formula described above and re-introducing the variable back into the BDD (step 420). After the BDDs are combined, the process stores the completed BDD for the sink node in an array (step 422) and returns to step 404, where it checks to see if the case-split stack is empty.

With reference now to FIG. 5, there is depicted a block diagram of a computer 502, which can be utilized to respectively perform and control the method and circuitry described above. Note also that some or all of the exemplary architecture shown for computer 502 may be utilized by software deploying server 550 shown in FIG. 5.

Computer 502 includes a processor unit 504 that is coupled to a system bus 506. A video adapter 508, which drives/supports a display 510, is also coupled to system bus 506. System bus 506 is coupled via a bus bridge 512 to an Input/Output (I/O) bus 514. An I/O interface 516 is coupled to I/O bus 514. 1/0 interface 516 affords communication with various I/O devices, including a keyboard 518, a mouse 520, a Compact Disk—Read Only Memory (CD-ROM) drive 522, a floppy disk drive 524, and a flash drive memory 526. The format of the ports connected to I/O interface 516 may be any known to those skilled in the art of computer architecture, including but not limited to Universal Serial Bus (USB) ports.

Computer 502 is able to communicate with a software deploying server 550 via a network 528 using a network interface 530, which is coupled to system bus 506. Network 528 may be an external network such as the Internet, or an internal network such as an Ethernet or a Virtual Private Network (VPN). Note the software deploying server 550 may utilize a same or substantially similar architecture as computer 502.

A hard drive interface 532 is also coupled to system bus 506. Hard drive interface 532 interfaces with a hard drive 534. In a preferred embodiment, hard drive 534 populates a system memory 536, which is also coupled to system bus 506. System memory is defined as a lowest level of volatile memory in computer 502. This volatile memory includes additional higher levels of volatile memory (not shown), including, but not limited to, cache memory, registers and buffers. Data that populates system memory 536 includes computer 502's operating system (OS) 538 and application programs 544. Case-split stack 552 stores the case-splits in a first-in first-out (FIFO) manner and resides in system memory 536.

OS 538 includes a shell 540, for providing transparent user access to resources such as application programs 544. Generally, shell 540 is a program that provides an interpreter and an interface between the user and the operating system. More specifically, shell 540 executes commands that are entered into a command line user interface or from a file. Thus, shell 540 (as it is called in UNIX®), also called a command processor in Windows®, is generally the highest level of the operating system software hierarchy and serves as a command interpreter. The shell provides a system prompt, interprets commands entered by keyboard, mouse, or other user input media, and sends the interpreted command(s) to the appropriate lower levels of the operating system (e.g., a kernel 542) for processing. Note that while shell 540 is a text-based, line-oriented user interface, the present invention will equally well support other user interface modes, such as graphical, voice, gestural, etc.

As depicted, OS 538 also includes kernel 542, which includes lower levels of functionality for OS 538, including providing essential services required by other parts of OS 538 and application programs 544, including memory management, process and task management, disk management, and mouse and keyboard management.

Application programs 544 include a browser 546. Browser 546 includes program modules and instructions enabling a World Wide Web (WWW) client (i.e., computer 502) to send and receive network messages to the Internet using Hyper-Text Transfer Protocol (HTTP) messaging, thus enabling communication with software deploying server 550.

Application programs 544 in computer 502's system memory (as well as software deploying server 550's system memory) also include a BDD Building Program 548. BDD Building Program 548 includes code for implementing the process described in FIG. 3 and FIG. 4. In one embodiment, computer 502 is able to download BDD Building Program 548 from software deploying server 550.

The hardware elements depicted in computer 502 are not intended to be exhaustive, but rather are representative to highlight essential components required by the present invention. For instance, computer 502 may include alternate memory storage devices such as magnetic cassettes, Digital Versatile Disks (DVDs), Bernoulli cartridges, and the like. These and other variations are intended to be within the spirit and scope of the present invention.

Note further that, in a preferred embodiment of the present invention, software deploying server 550 performs all of the functions associated with the present invention (including execution of BDD Building Program 548), thus freeing computer 502 from having to use its own internal computing resources to execute BDD Building Program 548.

In the preceding detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The preceding detailed description is, therefore, not to be taken in a limiting sense, and the scope of the present invention is defined only by the appended claims. In particular, although the preferred embodiment is described below with respect to a software system, it will be appreciated that the present invention is not limited to software implementations. It will be appreciated by one of ordinary skill in the art that the method described above will typically be carried out in software running on one or more processors (not shown), and that the software may be provided as a computer program element carried on any suitable data carrier (also not shown) such as a magnetic or optical computer disc. The channels for the transmission of data likewise may include storage media of all descriptions as well as signal carrying media, such as wired or wireless signal media.

Accordingly, the present invention may suitably be embodied as a computer program product for use with a computer system. Such an implementation may comprise a series of computer readable instructions either fixed on a tangible medium, such as a computer readable medium, for example, diskette, CD-ROM, ROM, or hard disk, or transmittable to a computer system, via a modem or other interface device, over either a tangible medium, including but not limited to optical or analog communications lines, or intangibly using wireless techniques, including but not limited to microwave, infrared or other transmission techniques. The series of computer readable instructions embodies all or part of the functionality previously described herein.

Those skilled in the art will appreciate that such computer-readable instructions can be written in a number of programming languages for use with many computer architectures or operating systems. Further, such instructions may be stored using any memory technology, present or future, including but not limited to, semiconductor, magnetic, or optical, or transmitted using any communications technology, present or future, including but not limited to optical, infrared, or microwave. It is contemplated that such a computer program product may be distributed as a removable medium with accompanying printed or electronic documentation, for example, shrink-wrapped software, pre-loaded with a computer system, for example, on a system ROM or fixed disk, or distributed from a server or electronic bulletin board over a network, for example, the Internet or World Wide Web.

What is claimed is:

1. A method in a computer system for building binary decision diagrams of a circuit design comprising:
   building a binary decision diagram for at least one node in a netlist graph representation of a circuit design;
   selecting at least one variable for case-splitting from a plurality of variables in said netlist graph representation of a circuit design;
   building a first binary decision diagram for the case of said at least one variable having a constant logical value of zero;
   building a second binary decision diagram for the case of said at least one variable having a constant logical value of one;
   determining whether said at least one variable is scheduled to be existentially quantified, universally quantified, or not quantified at all;
   in response to determining that said at least one variable is scheduled to be existentially quantified, building a third binary decision diagram equal to the logical disjunction of said first binary decision diagram and said second binary decision diagram;
   in response to determining that said at least one variable is scheduled to be universally quantified, building a third binary decision diagram equal to the logical conjunction of said first binary decision diagram and said second binary decision diagram;
   in response to determining that said at least one variable is not scheduled to be quantified, building a third binary decision diagram by logically combining said first binary decision diagram with said second binary decision diagram, whereby said variable is introduced into said third binary decision diagram;
   generating said binary decision diagrams in said computer system;
   storing one or more of said binary decision diagrams in a computer-readable storage device, whereby said one or more binary decision diagrams has a reduced number of peak live nodes;
   selecting a variable for a comparison with a reduction threshold, wherein said variable is included in the greatest number of nodes among all live binary decision diagrams;
   comparing the reduction of nodes obtained by setting said variable to a constant value with said reduction threshold;
   in response to determining that said reduction is greater than said reduction threshold, selecting said variable for case-splitting; and
   in response to determining that said reduction is less than said reduction threshold, selecting a different variable for a comparison with said reduction threshold.

2. The method according to claim 1, wherein at least one variable is selected for case-splitting when the step of building a binary decision diagram for at least one node in a netlist graph representation of a circuit design exceeds a predefined resource limit of said computer system.

3. The method according to claim 1, further comprising:
   in response to selecting more than one variable for case-splitting,
      storing a state of all live binary decision diagrams for each case-split on a stack in a system memory of said computer system; and
      reading said state of all live binary decision diagrams for each case-split from said memory stack in said computer system.

4. The method according to claim 3, wherein the storing and reading steps are performed in a first-in first-out (FIFO) manner.

5. The method according to claim 1, wherein the step of selecting a variable for case-splitting is biased toward selecting a variable that is scheduled to be quantified out.

6. The method according to claim 1, wherein the step of selecting a variable for case-splitting is biased toward selecting a variable that, when assigned a constant value, results in the reduction of the greatest number of nodes among all live binary decision diagrams.

7. A system for building binary decision diagrams of a circuit design comprising:
   a processor;
   a data bus coupled to the processor; and
   a computer-usable storage device embodying computer program code, the computer-usable storage device being coupled to the data bus, the computer program code comprising instructions executable by the processor and configured for:
      building a binary decision diagram for at least one node in a netlist graph representation of a circuit design;
      selecting at least one variable for case-splitting from a plurality of variables in said netlist graph representation of a circuit design;
      building a first binary decision diagram for the case of said at least one variable having a constant logical value of zero;
      building a second binary decision diagram for the case of said at least one variable having a constant logical value of one;
      determining whether said at least one variable is scheduled to be existentially quantified, universally quantified, or not quantified at all;
      in response to determining that said at least one variable is scheduled to be existentially quantified, building a third binary decision diagram equal to the logical disjunction of said first binary decision diagram and said second binary decision diagram;
      in response to determining that said at least one variable is scheduled to be universally quantified, building a third binary decision diagram equal to the logical conjunction of said first binary decision diagram and said second binary decision diagram;
      in response to determining that said at least one variable is not scheduled to be quantified, building a third binary decision diagram by logically combining said first binary decision diagram with said second binary decision diagram, whereby said variable is introduced into said third binary decision diagram;

storing one or more of said binary decision diagrams in said computer-readable storage device, whereby said one or more binary decision diagrams has a reduced number of peak live nodes;

selecting a variable for a comparison with a reduction threshold, wherein said variable is included in the greatest number of nodes among all live binary decision diagrams;

comparing the reduction of nodes obtained by setting said variable to a constant value with said reduction threshold;

in response to determining that said reduction is greater than said reduction threshold, selecting said variable for case-splitting; and in response to determining that said reduction is less than said reduction threshold, selecting a different variable for a comparison with said reduction threshold.

8. The system according to claim 7, wherein at least one variable is selected for case-splitting when the step of building a binary decision diagram for at least one node in a netlist graph representation of a circuit design exceeds a predefined resource limit of said computer system.

9. The system according to claim 7, further comprising:
in response to selecting more than one variable for case-splitting:
storing a state of all live binary decision diagrams for each case-split on a stack in a system memory of said computer system; and
reading said state of all live binary decision diagrams for each case-split from said memory stack in said computer system.

10. The system according to claim 9, wherein the storing and reading steps are performed in a first-in first-out (FIFO) manner.

11. The system according to claim 7, wherein the step of selecting a variable for case-splitting is biased toward selecting a variable that is scheduled to be quantified out.

12. The system according to claim 7, wherein the step of selecting a variable for case-splitting is biased toward selecting a variable that, when assigned a constant value, results in the reduction of the greatest number of nodes among all live binary decision diagrams.

13. A computer-readable storage device encoded with a computer program that, when executed by a computer, performs the steps of:
building a binary decision diagram for at least one node in a netlist graph representation of a circuit design;
selecting at least one variable for case-splitting from a plurality of variables in said netlist graph representation of a circuit design;
building a first binary decision diagram for the case of said at least one variable having a constant logical value of zero;
building a second binary decision diagram for the case of said at least one variable having a constant logical value of one;
determining whether said at least one variable is scheduled to be existentially quantified, universally quantified, or not quantified at all;
in response to determining that said at least one variable is scheduled to be existentially quantified, building a third binary decision diagram equal to the logical disjunction of said first binary decision diagram and said second binary decision diagram;
in response to determining that said at least one variable is scheduled to be universally quantified, building a third binary decision diagram equal to the logical conjunction of said first binary decision diagram and said second binary decision diagram;
in response to determining that said at least one variable is not scheduled to be quantified, building a third binary decision diagram by logically combining said first binary decision diagram with said second binary decision diagram, whereby said variable is introduced into said third binary decision diagram;
generating said binary decision diagrams in said computer system;
storing one or more of said binary decision diagrams in said computer-readable storage device, whereby said one or more binary decision diagrams has a reduced number of peak live nodes;
selecting a variable for a comparison with a reduction threshold, wherein said variable is included in the greatest number of nodes among all live binary decision diagrams;
comparing the reduction of nodes obtained by setting said variable to a constant value with said reduction threshold;
in response to determining that said reduction is greater than said reduction threshold, selecting said variable for case-splitting; and
in response to determining that said reduction is less than said reduction threshold, selecting a different variable for a comparison with said reduction threshold.

14. The computer-readable storage device according to claim 13, wherein at least one variable is selected for case-splitting when the step of building a binary decision diagram for at least one node in a netlist graph representation of a circuit design exceeds a predefined resource limit of said computer system.

15. The computer-readable storage device according to claim 13, further comprising:
in response to selecting more than one variable for case-splitting,
storing a state of all live binary decision diagrams for each case-split on a stack in a system memory of said computer system; and
reading said state of all live binary decision diagrams for each case-split from said memory stack in said computer system.

16. The computer-readable storage device according to claim 15, wherein the storing and reading steps are performed in a first-in first-out (FIFO) manner.

17. The computer-readable storage device according to claim 13, wherein the step of selecting a variable for case-splitting is biased toward selecting a variable that is scheduled to be quantified out.

* * * * *